(12) United States Patent
Doyle

(10) Patent No.: US 6,744,116 B1
(45) Date of Patent: Jun. 1, 2004

(54) THIN FILM USING NON-THERMAL TECHNIQUES

(75) Inventor: Brian S. Doyle, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/416,501

(22) Filed: Oct. 8, 1999

Related U.S. Application Data

(62) Division of application No. 09/107,398, filed on Jun. 30, 1998, now Pat. No. 6,423,614.

(51) Int. Cl.⁷ .............................................. H01L 29/67
(52) U.S. Cl. ..................... 257/611; 257/610; 257/611; 257/612; 257/635; 257/656
(58) Field of Search ................................ 257/610, 611, 257/612, 635, 656; 438/456, 458

(56) References Cited

U.S. PATENT DOCUMENTS

| | | | | |
|---|---|---|---|---|
| 4,489,478 A | * | 12/1984 | Sakurai ........................ 29/574 |
| 4,612,083 A | * | 9/1986 | Yasumoto et al. .......... 156/633 |
| 4,931,405 A | * | 6/1990 | Kamijo et al. ................. 437/12 |
| 4,956,693 A | * | 9/1990 | Sawahata et al. ............. 357/64 |
| 5,283,454 A | * | 2/1994 | Cambou ...................... 257/328 |
| 5,355,022 A | * | 10/1994 | Sugahara et al. ........... 257/768 |
| 5,412,231 A | * | 5/1995 | Furuya ........................ 257/192 |
| 5,453,394 A | * | 9/1995 | Yonehara et al. ............. 437/62 |
| 5,619,052 A | * | 4/1997 | Chang et al. ............... 257/321 |
| 5,622,886 A | * | 4/1997 | Allum et al. ................ 438/238 |
| 5,744,866 A | * | 4/1998 | Horiba ........................ 257/752 |
| 5,755,914 A | * | 5/1998 | Yonehara .................... 156/281 |
| 5,783,850 A | * | 7/1998 | Liau et al. .................. 257/355 |
| 5,856,229 A | * | 1/1999 | Sakaguchi et al. .......... 438/406 |
| 5,863,832 A | * | 1/1999 | Doyle et al. ................ 438/622 |
| 5,877,070 A | * | 3/1999 | Gosele et al. ............... 438/458 |
| 5,966,620 A | * | 10/1999 | Sakaguchi et al. .......... 438/455 |
| 6,057,212 A | * | 5/2000 | Chan et al. .................. 438/455 |
| 6,110,529 A | * | 8/2000 | Gardiner et al. ............ 427/250 |
| 6,118,181 A | * | 9/2000 | Merchant et al. ........... 257/757 |
| 6,136,666 A | * | 10/2000 | So .............................. 438/458 |
| 6,150,031 A | * | 11/2000 | Yonehara .................... 428/446 |
| 6,183,857 B1 | * | 2/2001 | Litwin et al. ............... 428/328 |
| 6,312,797 B1 | * | 11/2001 | Yokokawa et al. ......... 428/336 |
| 6,313,012 B1 | * | 11/2001 | Horiuchi et al. ............ 438/459 |

FOREIGN PATENT DOCUMENTS

| | | | | |
|---|---|---|---|---|
| JP | 358114468 | * | 7/1983 | ................ 257/611 |
| JP | 401157572 | * | 6/1989 | ................ 257/611 |

* cited by examiner

Primary Examiner—Allan R. Wilson
Assistant Examiner—Edgardo Ortiz
(74) Attorney, Agent, or Firm—Blakely, Sokoloff, Taylor & Zafman LLP

(57) ABSTRACT

A method for forming an integrated circuit is provided. A semiconductor film is formed onto a first substrate. A metal film is formed onto a second substrate. The second substrate is bonded with the metal film onto the thin film of the first substrate. A first layer of transistors is formed onto the film. The second substrate is removed at a temperature within a low temperature range. The semiconductor film is bonded with the first layer of transistors onto a second layer of transistors of a third substrate.

6 Claims, 8 Drawing Sheets

THIN FILM USING NON-THERMAL TECHNIQUES

This is a divisional of Ser. No. 09/107,398, filed Jun. 30, 1998 now U.S. Pat. No. 6,423,614.

BACKGROUND INFORMATION (1) Field of the Invention

The present invention generally relates to fabrication of semiconductor devices. More specifically, the present invention relates to fabrication of integrated circuits that utilize prefabricated transistor layers.

(2) Description of Related Art

Modern integrated circuits are generally made up of a silicon substrate containing millions of active and passive devices including transistors, capacitors, resistors, etc. Until recently, the semiconductor industry focused was on reducing the two dimensions, (X-Y) in a Cartesian system of coordinates, of the transistors to reduce the size of the integrated circuit. However, as integration in two dimension has become more and more difficult due to limitations of lithography tools, the exploitation of the third dimension (Z dimension in a Cartesian a system of coordinates) has become increasingly attractive.

FIG. 1 illustrates a conventional integrated circuit 100 that includes substrate 102 (typically made of silicon) onto which a very large number of active devices (transistors 104) are fabricated. Transistors 104 are intercoupled therebetween and to other devices, thereby forming various circuits, by way of an interconnect system that includes metal lines (106). The metal lines may further be connected to other circuits. The various circuits formed are further coupled, by well known techniques, to bond pads 108 of the integrated circuit. Transistors 104 are located on a single layer of silicon at the bottom of the integrated circuit. When the dimension of the gates of transistors 104 goes beyond 193 nanometers, which is shortest wave length of the light used in the present day photolithography process, integration of transistors becomes problematic as lithography tools that are utilized in the process of fabrication of these transistors reach the limit of their performance. One solution to increasing integration without further having to minimize transistors' gates dimensions and thus without resorting to new lithography tools, is to build up further layers of transistors in a third dimension (Z dimension) as illustrated in FIG. 2.

FIG. 2 illustrates an integrated circuit that includes a first silicon substrate (base substrate 202) onto which are built a first layer (film) 205 of active devices 204. A second layer (film) 206 of active devices 208 may be envisioned as being further built in the z dimension (vertically in the Figure). Interconnect lines 207 intercouple the active device 208 of second layer 206 to the active devices 204 of first layer 205. The second layer 206 of active devices 208 may be coupled to the outside world via bond pads 210.

In the display area (imaging) attempts have been made to integrate transistors in the third dimension. For example, some digital cameras use chips that have at the bottom thereof (at the base silicon substrate) transistors for logical operations and on top of those transistors are built display sensors. For example, CMOS sensor arrays may be built in the third dimension and used as light sensors. However, these transistors do not have good conducting properties, and therefore their performance is weak.

The second layer transistors are not made of a single-crystal silicon but are made of a polycrystalline silicon or amorphous silicon. The problem in providing a second layer of active devices (transistors) made of single silicon crystal is that the fabrication of the second level of transistors requires processing steps that are performed well beyond the temperature that the interconnect system may withstand. For example, at 400° or 450° Celsius, the metal lines begin to melt. It is desirable to provide an integrated circuit that overcomes the disadvantages associated with conventional devices.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION

One embodiment relates a first substrate with a semiconductor film formed thereon. The semiconductor film is demarcated from the rest of the first substrate by a damaged surface. Another embodiment relates to an integrated circuit with a second level of transistors in the Z dimension made of a single crystal.

In the following description, numerous specific details are set forth to provide a thorough understanding of the present invention. However, one having ordinary skill in the art should recognize that the invention may be practiced without these specific details. In some instances, well known circuits, structures, and techniques have not been shown in detail to avoid obscuring the present invention.

Figure 1:
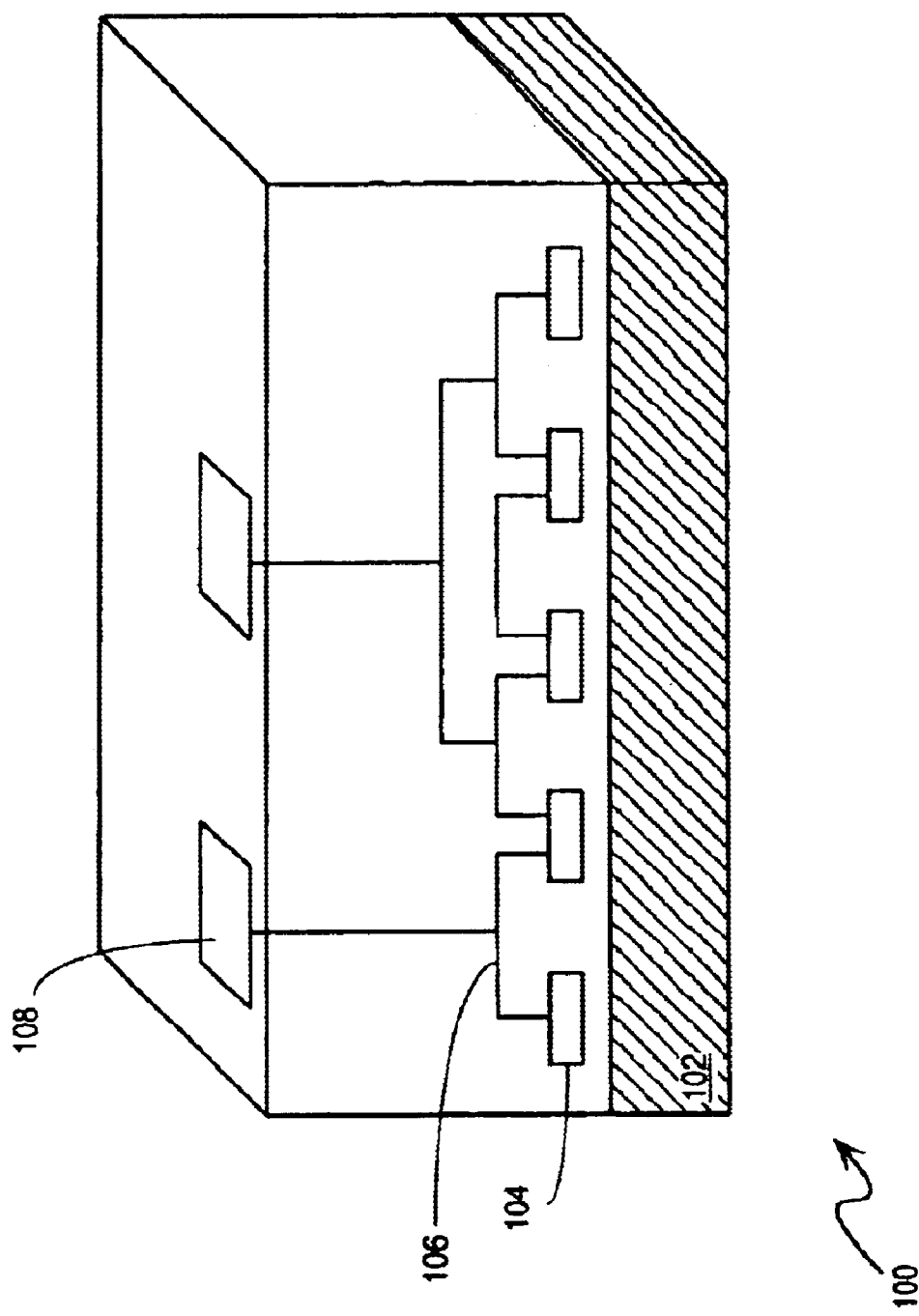
FIG. 1 illustrates a cross-sectional view through a conventional integrated circuit.
Figure 2:
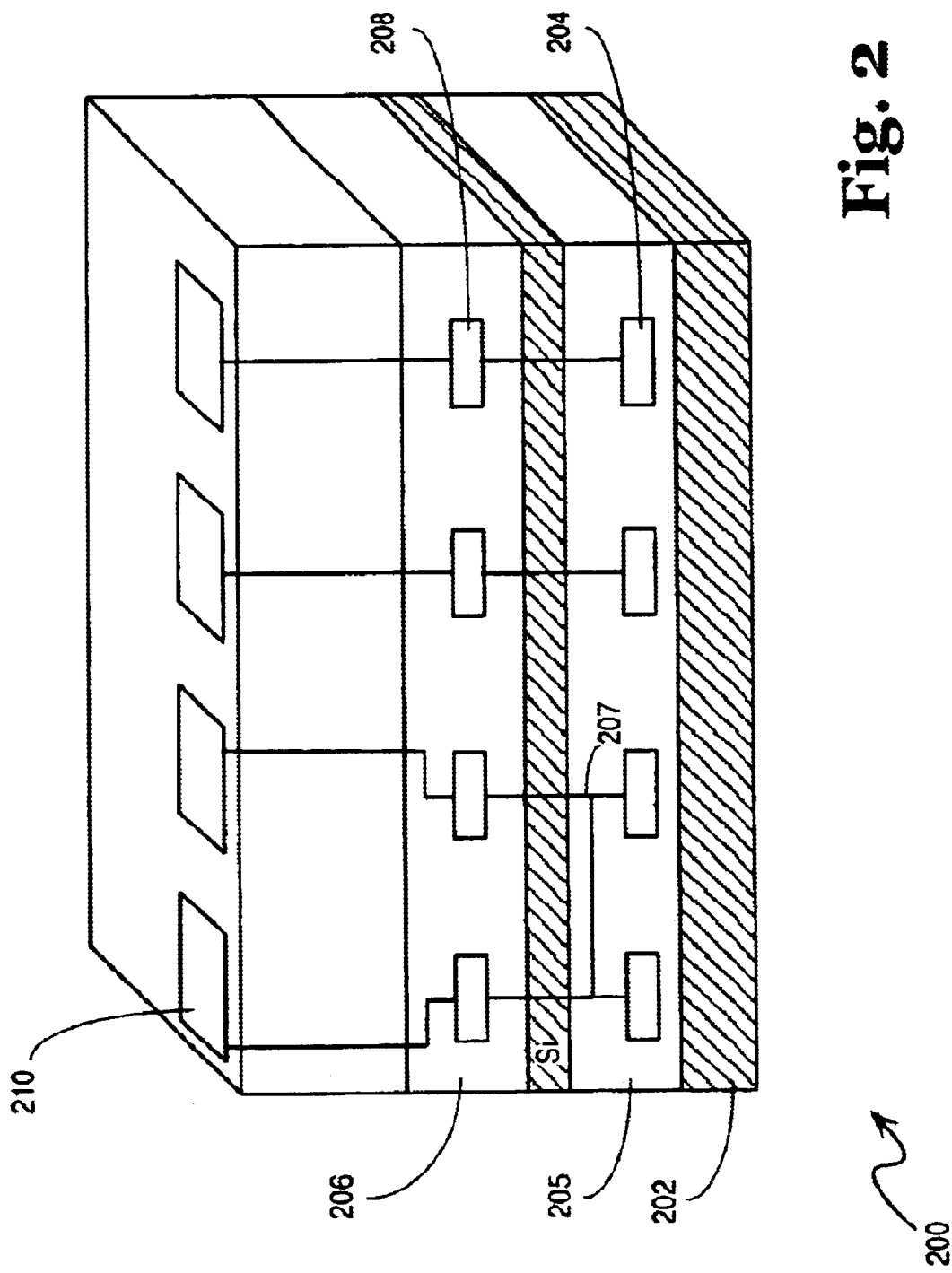
FIG. 2 illustrates a cross-sectional view through an integrated circuit with two layers of transistors.
Figure 3:
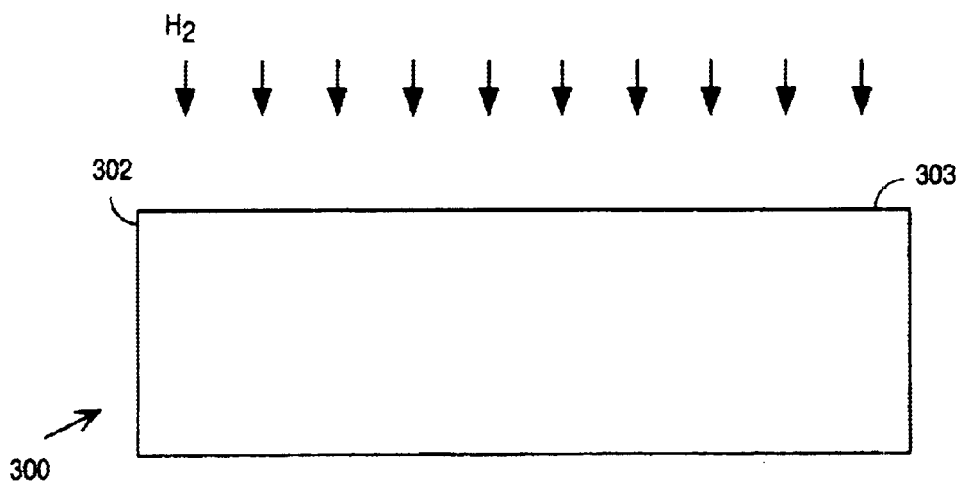
FIG. 3 illustrates a cross-sectional view through a substrate onto which hydrogen is implanted.

FIG. 3 illustrates a cross-sectional view through a first substrate 300, made of a semiconductor, onto which ions are implanted to form a thin film at a top portion 302 of the substrate. In one embodiment of the present invention described herein, the ions used for implantation are hydrogen ions. The energy of the hydrogen is chosen as a function of the thickness desired for the film. The higher the energy of the ions the thicker the film. The hydrogen ions may be 1E16-1E17 hydrogen.

Figure 4:
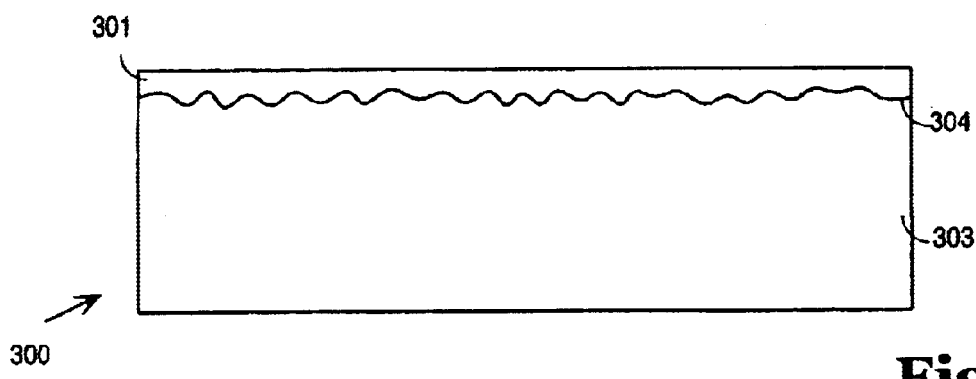
FIG. 4 illustrates a cross-sectional view through the first substrate with a film formed as a result of ion implantation.

FIG. 4 illustrates a cross sectional view of substrate 300 with film 301 formed by way of the ion implantation process. Film 301 is demarcated by damaged surface 304 created by the implantation of hydrogen ions. Damaged surface 304 causes weakening of the bonds otherwise existing between what is now film 301 and the rest of first substrate 303. Later, when substrate 300 is heated at a certain temperature (typically 400° Celsius) film 301 detaches from substrate 300.

Figure 5:
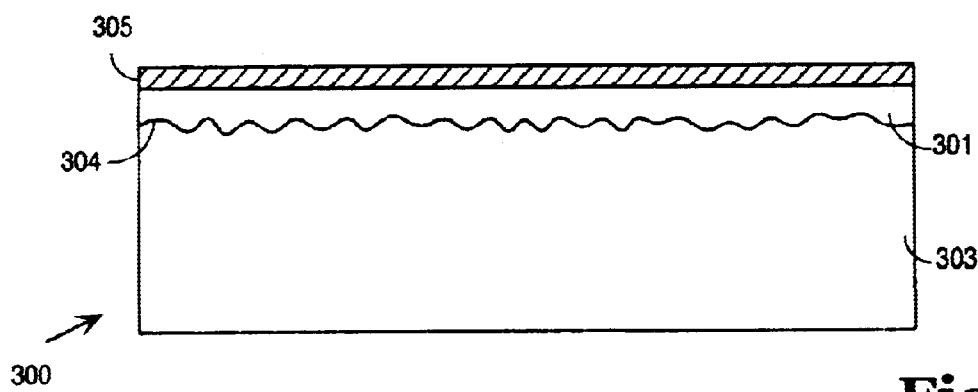
FIG. 5 illustrates a cross-sectional view through the first substrate with a layer of oxide formed on top of the film.

FIG. 5 illustrates a layer of oxide 305 formed onto the film 301. Layer of oxide 305 is deposited onto film 301 so that later in the process, when the first substrate with film 301 and oxide film 305 is bonded to a second substrate with a metal film 301 (not shown), the oxide 305 facilitates debonding of the film 301 from the second substrate with the metal film.

The oxide layer may be formed by deposition of a TEOS oxide, or a nitride layer. Alternatively, the oxide film may be thermally grown on surface 303 of the substrate 300 (FIG. 3) before hydrogen implantation. The hydrogen introduced later on in the process during hydrogen implantation, reacts with the metal at the metal-oxide interface, and passivates the bonds that cause adherence of the metal film (not shown) to the oxide 305.

Figure 6:
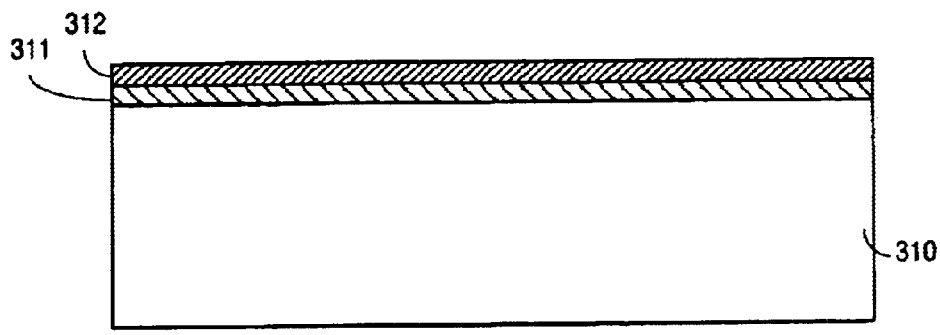
FIG. 6 illustrates a second substrate with a layer of metal formed on top of the second substrate.

FIG. 6 illustrates a cross-sectional view through a second substrate 310 onto which a metal film 312 is formed typically by sputtering. The metal film may be made of a noble metal such as platinum (tungsten) by way of example. The metal film could have any thickness from a few hundred Angstroms to a few thousand Angstroms or more. The metal film is bonded to a thin film of oxide (311) necessary to ensure that the metal does not form a silicide during later high temperature processing. This film can be deposited (TEOS) for example, or can be thermally grown on the silicon substrate 310. The metal film is utilized for its properties according to which if another structure is bonded to the metal film, and then later a hydrogen annealing step is performed to the bonded structures, it is easier to delaminate the other structures bonded to the metal film at she interface between the metal film and the other structure. The hydrogen bonds to the metal of this interface, terminating the adhesion bonds between metal and oxide. Debonding may be performed smoothly by way of hydrogen annealing at a lower temperature that may not damage certain structures, such as active devices, later built on film 301.

Figure 7:
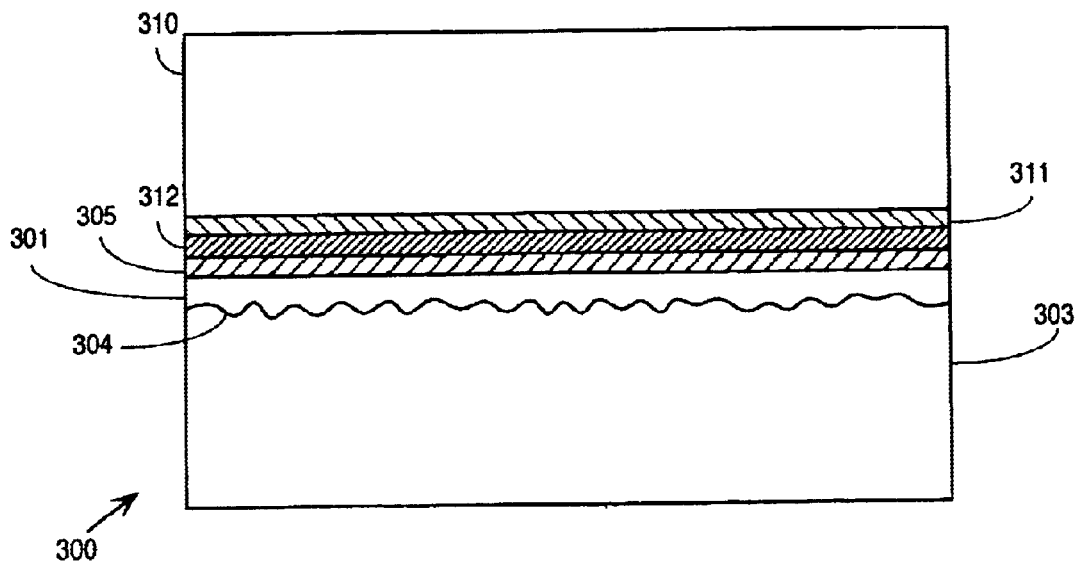
FIG. 7 illustrates a cross-sectional view of the first substrate with a film and a layer of oxide on which the second substrate with the metal film are bonded.

FIG. 7 illustrates a cross-sectional view of first substrate 300 with the first film 301 and oxide film 305 onto which the second substrate 310 with the metal film 312 are placed. The two substrates 300 and 310 with their respective films are then bonded by way of annealing (heating at a temperature of approximately 400° Celsius). One of the properties of noble metals such as platinum (tungsten) is that films, made of these metals are much easier debonded from silicon films such as 301 upon low-temperature hydrogen annealing, which is performed later in the process. When hydrogen is introduced in the environment later on in the process (FIG. 8), hydrogen diffuses through layer 301 and 312 causing the interface between these two layers to delaminate.

Figure 8:
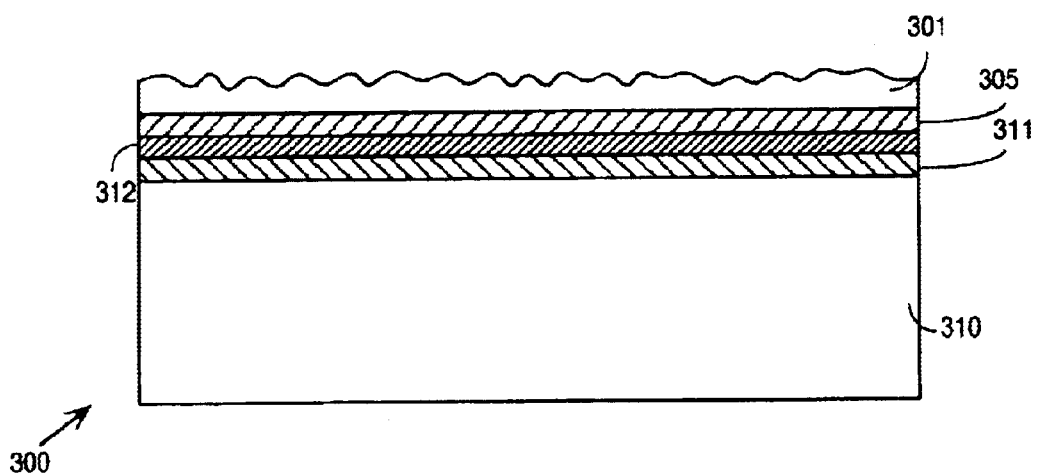
FIG. 8 illustrates the assembly of FIG. 7 turned upside down with the first substrate debonded.

Next, in the process according to one embodiment of the present invention, the assembly illustrated in FIG. 7 is heated at a temperature of approximately 400° Celsius that causes the film 301, with rough layer of oxide 305 to bond to metal film 312. The increased temperature of 400° Celsius also causes the rest of first substrate 303 to delaminate from the thin film 301. The reason is that the bonds between film 301 and the rest of first substrate 303 are weakened as a result of the hydrogen implantation discussed in connection with the cross-sectional view of the embodiment illustrated in FIG. 3. The remaining assembly, which includes thin film 301, oxide layer 305, oxide layer 311, metal layer 312, and the second substrate 310, is then flipped over such that film 301 is at the top of the assembly as shown in FIG. 8. The film 301 of FIG. 8 is then polished by a process of Chemical Mechanical Polishing (CMP), for example, and then active devices are formed in film 301 by conventional methods including etching, making trenches, ion implantation, forming the gate-oxide, etc.

Figure 9:
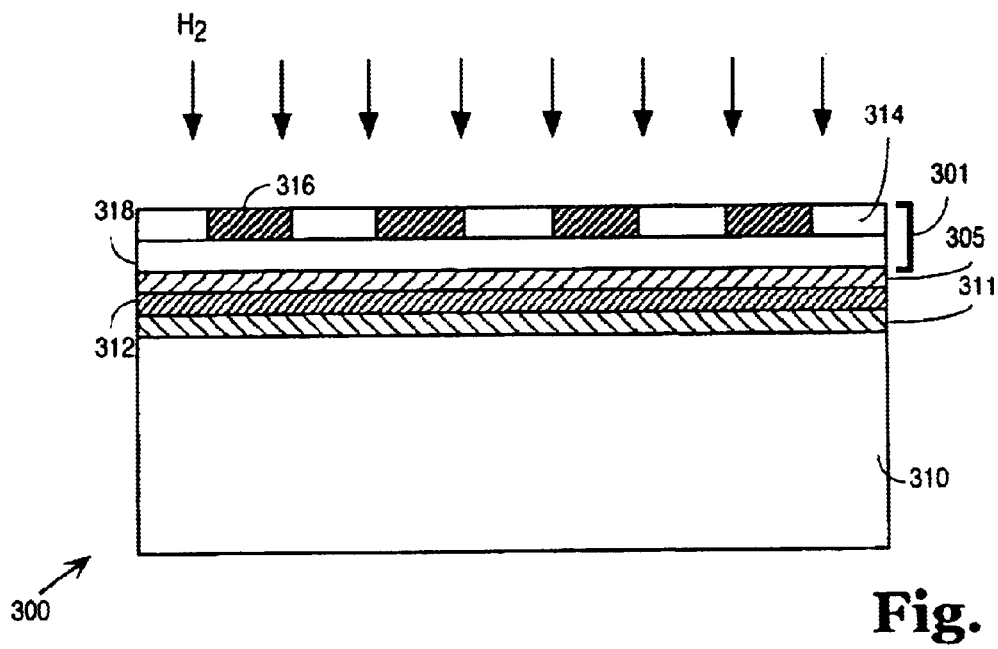
FIG. 9 illustrates the assembly of FIG. 8 with active devices formed onto the film and subjected to a process of low-temperature annealing.

FIG. 9 illustrates the assembly of FIG. 8 with first layer 314 of transistors 316 formed onto film 301. The remaining part 318 of film 301 has a thickness of approximately 2 micrometers while first layer 314 of transistors 316 also has a thickness of approximately 2 micrometers.

FIG. 9 also illustrates the assembly subjected to a low temperature process of annealing. In one embodiment of the process of the present invention described herein, the low-temperature process of annealing is a process of hydrogen incorporation. The process described below describes hydrogen annealing as the method of hydrogen inclusion. However, other methods, such as hydrogen implantation, might also be used. Hydrogen annealing has the net effect of causing silicon film 301 delaminate from the second substrate 310. The interface between silicon film 301 and the silicon substrate 310 with metal film 312 is replaced by bonds between hydrogen atoms that penetrate between metal layer 312 and oxide films 305. This new interface is easier to break down when the assembly is heated to a temperature of approximately 400° Celsius for 30 minutes during hydrogen annealing. This allows hydrogen annealing to be performed at a relatively low temperature at which transistors 316 of first layer 314 are not damaged.

Figure 10:
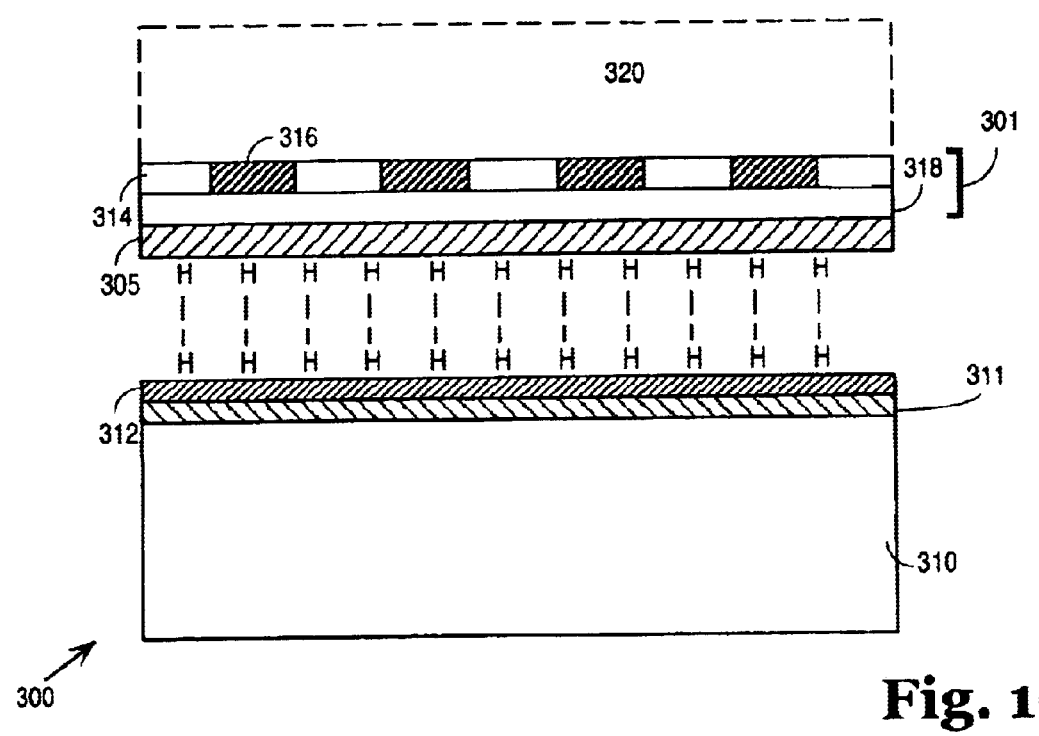
FIG. 10 illustrates the assembly of FIG. 9 with the film debonded from the second substrate.

FIG. 10 illustrates two parts of the assembly resulting from the process of hydrogen annealing. The diffusion of hydrogen at the interface between film 301 (oxide film 305) and metal layer 312 reduces or eliminates the bonds between these two layers. Silicon film 301 (oxide film 305) and the metal layer 312, thus terminate on hydrogen instead of terminating on another layer, causing second substrate 310 to detach from its bonding with film 301 via metal 312.

The hydrogen annealing process is known in the art. A subject to be annealed is heated in a hydrogen ambient medium. The hydrogen atoms diffuse through film 301 and get to metal 312 causing the interface (between 301 and 312) to delaminate. The film of oxide 305 facilitates the debonding between the metal layer 312 and the film 301 as noble metals delaminate very well from oxide.

A third substrate 320 (carrier wafer) (shown in dotted lines) is then placed onto the transistor layer 314. The temperature of 400° Celsius causes bonding of carrier wafer 320 to the transistors layer 314. Carrier wafer 320 that is used for supporting the transistor layer 314 may be the final substrate, or may be a temporary substrate (when this layer is later delaminated and bonded to another layer of transistors of a third substrate) (not shown).

After second substrate 310 has been removed by way of the hydrogen annealing process, any remaining portion of metal or of oxide film 305 is stripped off the oxide film 305 by way of etching (dry etched in a fluorine based chemistry or can be polished off).

Figure 11:
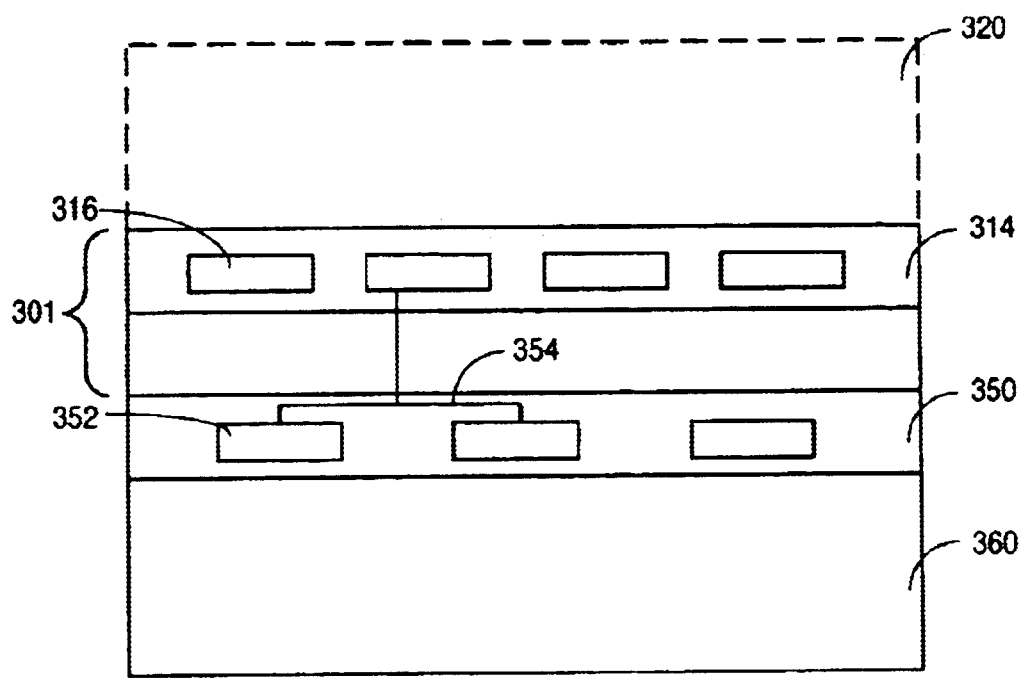
FIG. 11 illustrates a cross-sectional view through a third substrate with a layer of transistors onto which the film with its transistor is bonded.

The embodiment of process according to the present invention then continues with replacing film 301 bonded to carrier 320 on a layer 350 of transistors 352 of a third substrate 360 shown in FIG. 11. Transistors 352 and 316 are interconnected by lines 354. The new assembly illustrated in FIG. 11 is then heated at a temperature of 400 degrees Celsius at which the film 301 bonds to the film 350 and the carrier 320 debonds from the film 301 of transistors 316.

Typically, the carrier wafer 320 is made of transparent materials such as quartz to allow alignment of the transistors of the two layers 314 and 350. The alignment between the two layers of transistors may be performed by well known methods in the art. After alignment, the carrier 320 is debonded from the first transistor layer 314. At this stage, the carrier 320 has served its purpose and can be stripped off.

The embodiment described above describes a system which incorporates two layers of transistors. It should be appreciated by persons skilled in the art that the process described herein may be used on a single layer of transistors to allow patterning of the underside of this single layer of transistor also. The underside patterning may be performed at the step corresponding to FIG. 9. In this case, the substrate 320 in FIG. 10 becomes the final substrate, and transistors are fabricated on the now-exposed surface of 301, after the removal of the oxide layer 305.

Figure 12:
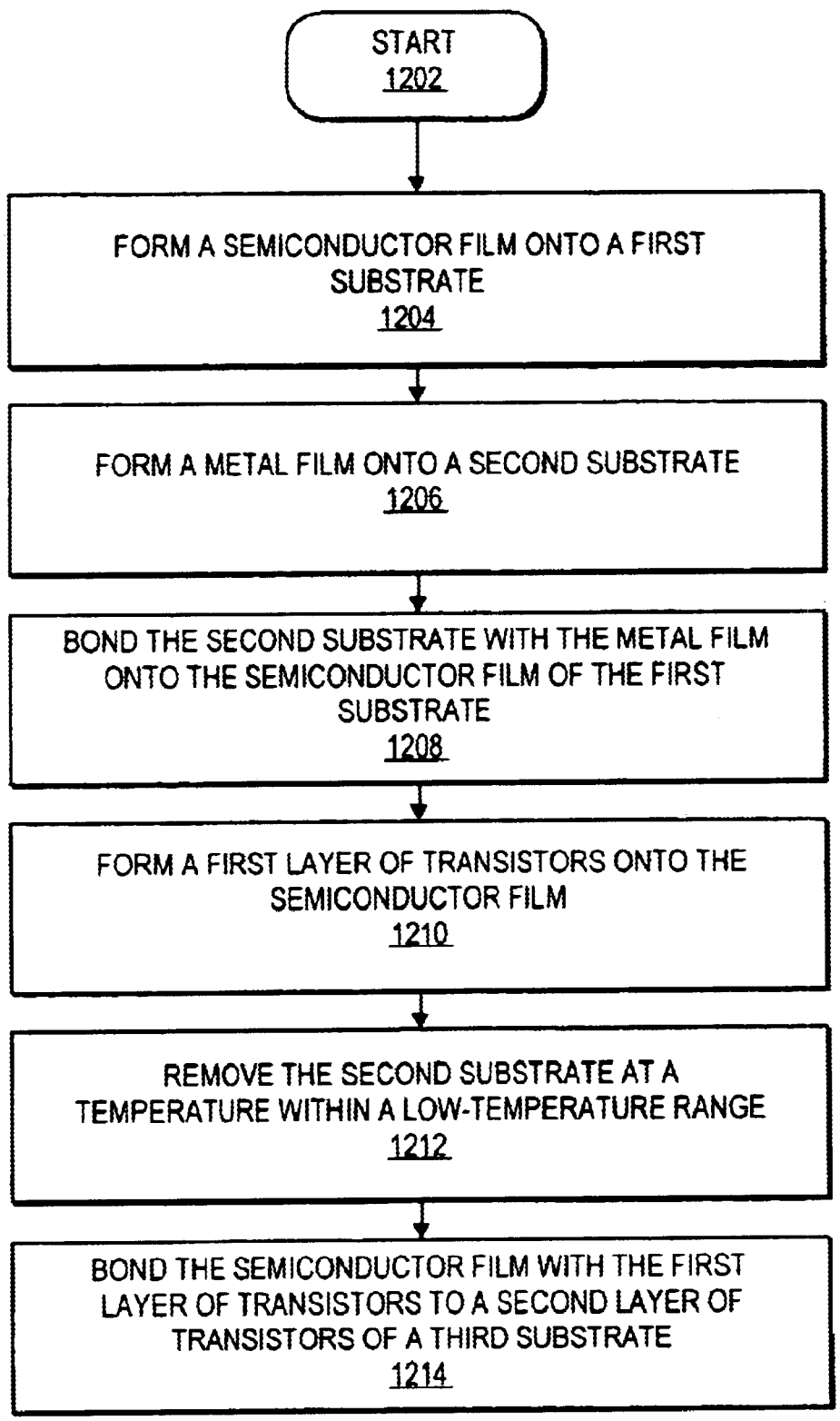
FIG. 12 illustrates a flowchart diagram in connection with the embodiment of the process according to the present invention described herein.

FIG. 12 illustrates a flowchart diagram in connection with one embodiment of a process for making an integrated circuit according to the present invention. The process starts at block 1202 from where it passes to block 1204. At block 1204 a semiconductor film is formed onto a first substrate. The process then passes to block 1206 where a metal film is formed onto a second substrate. The process continues to block 1208 where a second substrate is bonded with a metal film onto the semiconductor film of the first substrate. At block 1210, a first layer of transistors is formed onto the semiconductor film. The process continues to block 1212 where the second substrate is removed at a temperature within a low temperature range. The process then passes to block 1214 where the semiconductor film with the first layer of transistors is bonded to a second layer of transistors of a third substrate.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention.

What is claimed is:

1. An apparatus comprising:
    a first substrate portion having a plurality of active devices formed thereon and defining a first device surface; and
    a second single crystal substrate portion having active devices formed thereon and defining a second device surface,
        wherein the first device surface of the first substrate portion is bonded directly to the second device surface of the second substrate portion by a thermal anneal at a temperature suitable to device structures on the first and second device structures, and
        wherein selected ones of said active devices of said second substrate portion are intercoupled via metal lines.

2. The apparatus of claim 1, wherein selected ones of the devices of the first substrate portion and selected ones of the devices of the second substrate portion are interconnected.

3. An apparatus comprising:
    a primary substrate having a first level of devices formed thereon and defining a first device surface; and
    at least one secondary single crystal substrate having active devices formed thereon and defining a second device surface, wherein the first device surface of the primary substrate is connected directly to the second device surface of the at least one secondary single crystal substrate such that selected ones of said active devices of said at least one secondary single crystal substrate are intercoupled via metal lines to selected ones of the first level of devices of the primary substrate, and wherein the bond joint between the primary substrate and the secondary substrate is formed by a thermal anneal at a temperature suitable to device structures on the primary substrate and the secondary substrate.

4. The apparatus of claim 1, wherein said first substrate portion is made of a single crystal silicon.

5. The apparatus of claim 3, wherein said primary substrate is made of a single crystal silicon.

6. The apparatus of claim 1, wherein the first substrate portion is formed as a film of less than an entire portion of a starting material by demarcating a film thickness through an ion implantation into the starting material and separating the first substrate portion from the starting material.

* * * * *

UNITED STATES PATENT AND TRADEMARK OFFICE
CERTIFICATE OF CORRECTION

PATENT NO. : 6,744,116 B1
DATED : June 1, 2004
INVENTOR(S) : Doyle

It is certified that error appears in the above-identified patent and that said Letters Patent is hereby corrected as shown below:

Column 3,
Line 43, delete "she" and insert -- the --.

Column 4,
Line 27, after "301", insert -- to --.

Column 5,
Line 1, delete both occurrence of "a".
Line 5, before "film 301", delete "the".

Signed and Sealed this

Sixteenth Day of November, 2004

JON W. DUDAS
*Director of the United States Patent and Trademark Office*